United States Patent
Shaffer et al.

(10) Patent No.: US 11,885,854 B2
(45) Date of Patent: Jan. 30, 2024

(54) TESTERS, TESTING SYSTEMS AND METHODS OF TESTING ELECTRICAL COMPONENTS

(71) Applicant: GM GLOBAL TECHNOLOGY OPERATIONS LLC, Detroit, MI (US)

(72) Inventors: Michael H. Shaffer, Almont, MI (US); Gustavo Sanchez Taccone, Dublin (IE); Aaron Cullen, Avoca (IE); Ronan Conneely, Glanmire (IE); Stonewall Jackson Craig, III, Macomb Township, MI (US); Jimmy D Hart, Marlow, OK (US); Charles Wallace Thompson, Smiths Grove, KY (US)

(73) Assignee: GM GLOBAL TECHNOLOGY OPERATIONS LLC, Detroit, MI (US)

( * ) Notice: Subject to any disclaimer, the term of this patent is extended or adjusted under 35 U.S.C. 154(b) by 0 days.

(21) Appl. No.: 17/664,724

(22) Filed: May 24, 2022

(65) Prior Publication Data

US 2023/0384397 A1    Nov. 30, 2023

(51) Int. Cl.
*G01R 31/58* (2020.01)
*G01R 31/00* (2006.01)

(52) U.S. Cl.
CPC ........... *G01R 31/58* (2020.01); *G01R 31/006* (2013.01)

(58) Field of Classification Search
CPC .......... G01R 31/50–74; G01R 31/006
See application file for complete search history.

(56) References Cited

U.S. PATENT DOCUMENTS

| | | | | |
|---|---|---|---|---|
| 3,699,438 A * | 10/1972 | Webb | | G01R 31/60 |
| | | | | 324/66 |
| 4,959,792 A * | 9/1990 | Sullivan | | G01R 31/58 |
| | | | | 324/555 |
| 5,072,185 A * | 12/1991 | Rockwell | | G01R 31/58 |
| | | | | 29/593 |
| 5,250,908 A * | 10/1993 | Liu | | G01R 31/67 |
| | | | | 324/763.01 |
| 5,491,418 A * | 2/1996 | Alfaro | | G01R 31/007 |
| | | | | 340/3.1 |
| 6,498,995 B2 * | 12/2002 | Kawase | | G01R 31/69 |
| | | | | 702/58 |
| 7,881,887 B2 * | 2/2011 | Kinahan | | G01R 31/58 |
| | | | | 702/123 |
| 9,753,095 B2 * | 9/2017 | Partee | | G01R 31/40 |
| 2003/0006779 A1 * | 1/2003 | H. Youval | | G01R 31/50 |
| | | | | 324/503 |

(Continued)

FOREIGN PATENT DOCUMENTS

CN    109581255 A *  4/2019

*Primary Examiner* — Patrick Assouad
*Assistant Examiner* — Demetrius R Pretlow
(74) *Attorney, Agent, or Firm* — Lorenz & Kopf LLP

(57) ABSTRACT

A tester for testing an electrical component. The tester includes a database of testing specifications for electrical components, a tester connector for physically and electrically connecting to different electrical components, and an output device. The tester identifies an electrical component connected to the tester connector and provide corresponding identification data, retrieves a testing specification from the database using the identification data, commands a test of the electrical component according to the testing specification, and outputs an indication of a result of the test through the output device.

20 Claims, 6 Drawing Sheets

(56) References Cited

U.S. PATENT DOCUMENTS

| | | | |
|---|---|---|---|
| 2003/0057959 A1* | 3/2003 | Teich | G01R 31/67 |
| | | | 324/539 |
| 2003/0144817 A1* | 7/2003 | Smith | G01R 31/67 |
| | | | 702/183 |
| 2005/0212526 A1* | 9/2005 | Blades | G01R 31/67 |
| | | | 324/543 |
| 2011/0187385 A1* | 8/2011 | Betz | G01R 31/31855 |
| | | | 324/543 |
| 2013/0221982 A1 | 8/2013 | Julson et al. | |
| 2020/0174058 A1* | 6/2020 | Schmier, II | G01R 31/69 |
| 2021/0223286 A1* | 7/2021 | Lussier | G01R 31/44 |

* cited by examiner

TESTERS, TESTING SYSTEMS AND METHODS OF TESTING ELECTRICAL COMPONENTS

The present disclosure generally relates to testing electrical components. The present disclosure is particularly concerned with testing electrical components of automotive vehicles.

INTRODUCTION

Suppliers of electrical components for vehicles, such as wiring harnesses, often perform a continuity, and other health, check on each electrical component at an end of a manufacturing process and potentially at other stages during incorporation of the electrical component into the vehicle. Testing of an electrical component is an important phase in the production process. Terminal crimp, wire condition and continuity, for example, are some key attributes of an electrical component to be tested.

Because electrical components of vehicles, such as wiring harnesses, have a wide variety of configurations (in terms of the number of wires/circuits they include and/or the number or types of connectors they employ), custom testers may be required for each different electrical component or a slow process of testing pairs of terminals individually is used. Such solutions can be impractical or cost prohibitive.

Accordingly, it is desirable to provide a testing system, a tester and a method for testing a plurality of different types of electrical components. It would be desirable if such systems and apparatus are able to accommodate a wide variety of electrical components using the same tester regardless of their configuration (size, number of wires, connector types, etc.), and can allow the electrical characteristics of those electrical components to be accurately and reliably tested even when the particular configuration varies. Furthermore, other desirable features and characteristics of the present invention will become apparent from the subsequent detailed description and the appended claims, taken in conjunction with the accompanying drawings and the foregoing technical field and background.

SUMMARY

In one aspect, a tester is provided for testing an electrical component. The tester includes a database of testing specifications for electrical components, a tester connector for physically and electrically connecting to different electrical components, an output device, and a processor in operable communication with the database and the output device. The processor is configured to execute program instructions, wherein the program instructions are configured to cause the processor to: identify an electrical component connected to the tester connector and provide corresponding identification data, retrieve a testing specification from the database using the identification data, command a test of the electrical component according to the testing specification, and output an indication of a result of the test through the output device.

In embodiments, the tester includes analog circuitry through which the test is conducted.

In embodiments, the electrical component is identified by measuring an electrical property of the electrical component connected to the tester connector, wherein the electrical property is characteristic of the electrical component connected to the tester connector.

In embodiments, the test is to recognize a fault in the electrical component.

In embodiments, the electrical component includes a wiring harness and/or a sensor.

In embodiments, the tester includes a multiplexer. The testing specifications in the database describe pairs of terminals of a connector of respective electrical components. The test includes applying an electrical signal to each of the pairs of terminals via the multiplexer and according to the testing specification.

In embodiments, the output device includes different color lighting and/or a display including a screen.

In embodiments, the testing specifications in the database describe reference values of an electrical property. The test includes measuring measurement values of the electrical property. The program instructions are configured to cause the processor to determine the result of the test by including comparing the reference values and the measurement values.

In embodiments, the tester is a portable device.

In embodiments, the tester includes a battery for providing power to conduct the test.

In embodiments, the tester includes a communications device. The program instructions are configured to cause the processor to: add testing specifications to the database, modify the testing specifications or remove testing specifications from the database based on data received from a remote service via the communications device.

In another aspect, a testing system is provided. The testing system includes a plurality of adapters. Each adapter includes an adapter-component connector at one end of a cable and an adapter-tester connector at another end of the cable. Respective adapter-component connectors are for physically and electrically connecting to different electrical components. A tester is included for testing one of the electrical components. The tester includes a tester connector for physically and electrically connecting to any one of the adapter-tester component connectors. The testing system includes a database of testing specifications for the electrical components, an output device, and a processor in operable communication with the database and the output device. The processor is configured to execute program instructions. The program instructions are configured to cause the processor to: identify one of the electrical components connected to the tester connector using one of the plurality of adapters and provide corresponding identification data, retrieve a testing specification from the database using the identification data, command a test of the one of the electrical components according to the testing specification, and output an indication of a result of the test through the output device.

In embodiments, the tester includes analog circuitry through which the test is conducted.

In embodiments, the one of the electrical components is identified by measuring an electrical property of the one of the electrical components and/or the one of the plurality of adapters. The electrical property is characteristic of the one of the electrical components and/or the one of the adapters.

In embodiments, the electrical components include a wiring harness and/or a sensor.

In embodiments, the tester includes a multiplexer. The testing specifications in the database describe pairs of terminals of a connector of respective electrical components. The test includes applying an electrical signal to each of the pairs of terminals via the multiplexer and according to the testing specification.

In embodiments, the testing specifications in the database describe reference values of an electrical property. The test includes measuring measurement values of the electrical property, and wherein the program instructions are configured to cause the processor to: determine the result of the test by including comparing the reference values and the measurement values.

In embodiments, the tester includes a communications device. The program instructions are configured to cause the processor to: add testing specifications to the database, modify the testing specifications or remove testing specifications from the database based on data received from a remote server via the communications device.

In another aspect, a method of testing an electrical component of a vehicle is provided. The electrical component includes a harness or a sensor. The method includes the following steps: providing a plurality of adapters, each adapter including an adapter-component connector at one end of a cable and an adapter-tester connector at another end of the cable, wherein respective adapter-component connectors are for physically and electrically connecting to different electrical components of the vehicle; providing a tester for testing one of the electrical components, the tester including a tester connector for physically and electrically connecting to any one of the adapter-tester component connectors; providing a database of testing specifications for the electrical components; providing an output device; identifying, via a processor, one of the electrical components connected to the tester connector using one of the plurality of adapters and providing corresponding identification data; retrieving, via the processor, a testing specification from the database using the identification data; commanding, via the processor, a test of the one of the electrical components according to the testing specification; and outputting an indication of a result of the test through the output device.

In embodiments, the tester includes a multiplexer. The testing specifications in the database describe pairs of terminals of a connector of respective electrical components. The test includes applying an electrical signal to each of the pairs of terminals via the multiplexer according to the testing specification.

BRIEF DESCRIPTION OF THE DRAWINGS

The exemplary embodiments will hereinafter be described in conjunction with the following drawing figures, wherein like numerals denote like elements, and wherein.

DETAILED DESCRIPTION

Figure 1A:
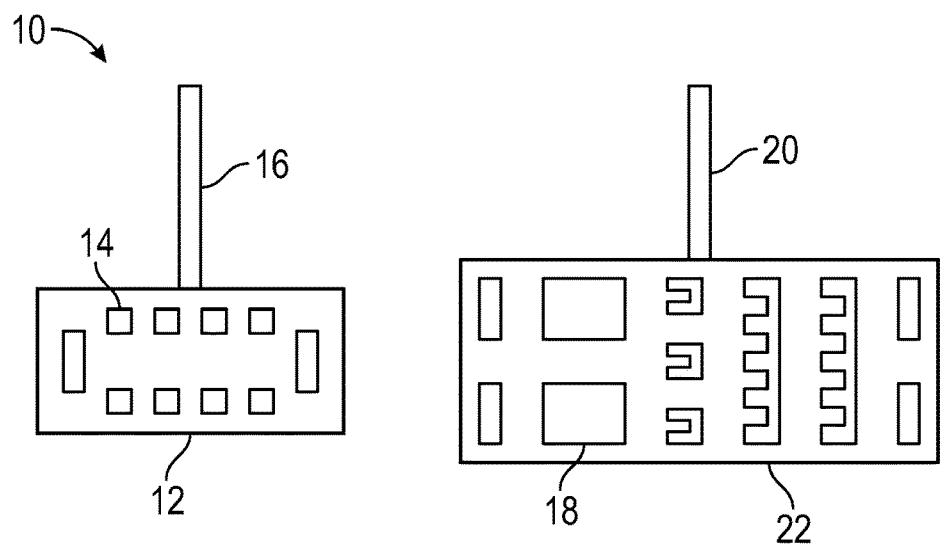
FIGS. 1A and 1B provide a functional block diagram illustrating a testing system, in accordance with various embodiments.

The following detailed description is merely exemplary in nature and is not intended to limit the application and uses. Furthermore, there is no intention to be bound by any expressed or implied theory presented in the preceding technical field, background, brief summary or the following detailed description. As used herein, the term module refers to any hardware, software, firmware, electronic control component, processing logic, and/or processor device, individually or in any combination, including without limitation: application specific integrated circuit (ASIC), an electronic circuit, a processor (shared, dedicated, or group) and memory that executes one or more software or firmware programs, a combinational logic circuit, and/or other suitable components that provide the described functionality.

Embodiments of the present disclosure may be described herein in terms of functional and/or logical block components and various processing steps. It should be appreciated that such block components may be realized by any number of hardware, software, and/or firmware components configured to perform the specified functions. For example, an embodiment of the present disclosure may employ various integrated circuit components, e.g., memory elements, digital signal processing elements, logic elements, look-up tables, or the like, which may carry out a variety of functions under the control of one or more microprocessors or other control devices. In addition, those skilled in the art will appreciate that embodiments of the present disclosure may be practiced in conjunction with any number of systems, and that the systems described herein is merely exemplary embodiments of the present disclosure.

For the sake of brevity, conventional techniques related to signal processing, data transmission, signaling, control, and other functional aspects of the systems (and the individual operating components of the systems) may not be described in detail herein. Furthermore, the connecting lines shown in the various figures contained herein are intended to represent example functional relationships and/or physical couplings between the various elements. It should be noted that many alternative or additional functional relationships or physical connections may be present in an embodiment of the present disclosure.

Some embodiments described herein provide a portable wiring harness, sensor and other electrical component tester. The tester can be in the form of a portable tool that checks continuity and resistance of all wires in a wiring harnesses (or sensor) to quickly determine if any circuit pairs are open. The tester allows rapid identification of wiring harness/sensor issues and mitigates against rework during assembly.

There is disclosed herein a computer controlled tester that diagnoses all pairs in a wiring harness, sensor or other electrical tester at substantially the same time. The tester automatically detects a wiring harness/sensor/electrical component type based on adapters connected between the tester and the electrical component. The tester retrieves a testing specification of that electrical component and performs the test specifically for that type of electrical component according to the testing specification. The tester may display a test result and record the result for long term retention and analysis. The tester is capable of storing information about wiring harnesses and sensors (or other electrical components), and determines whether the wiring harnesses and sensor pass or fail the test. The tester is configurable for different types of harnesses and sensors and the database is updateable when new sensors or harness are created. The tool may be portable and battery powered. The tool has a display to show a graphical representation of a problem connection pair.

Figure 1A:
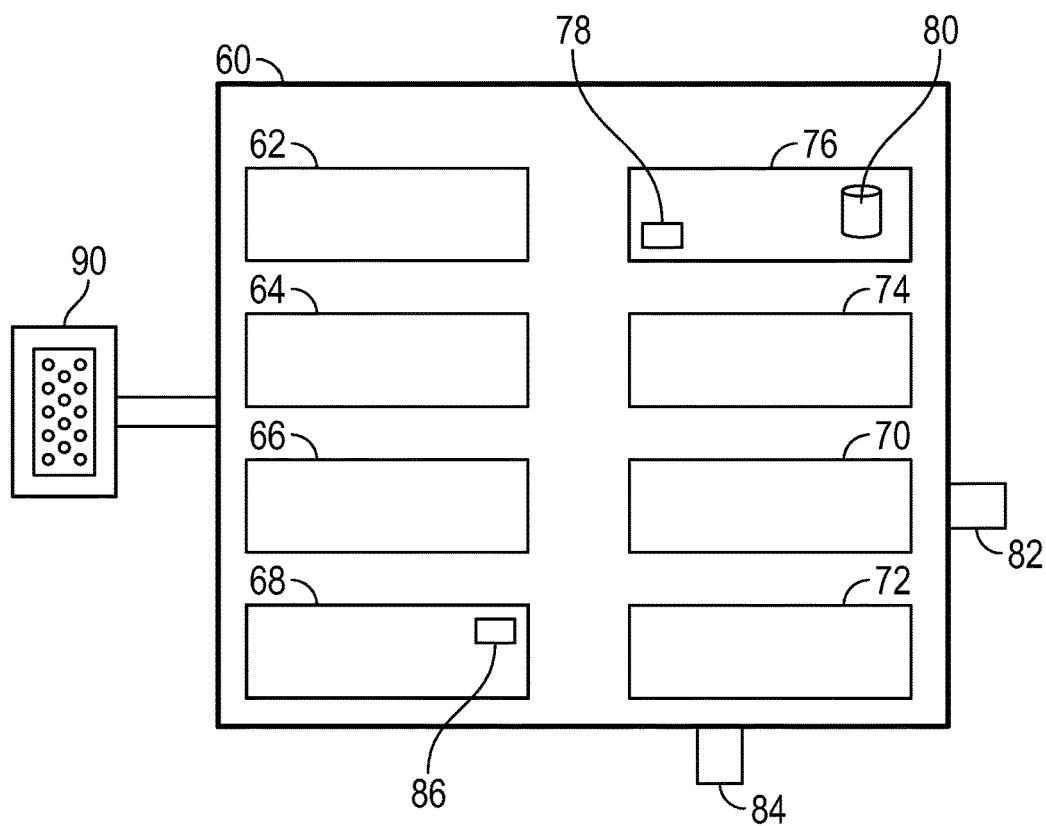

Embodiments described herein with respect to FIGS. 1 to 3 relate particularly to an example of wiring harness testing systems and apparatus that can be used, for example, in the testing of wiring harnesses (or sensors) such as those used in the automotive industry, e.g. in vehicles. It should, however, be appreciated that the testing systems, methods and testers disclosed herein can be applied to testing other electrical components used in vehicles and electrical components used in other industries. Any system of electrical components that utilize a plurality of different connectors may connect to the adapters and tester of the present disclosure for testing purposes. As such, the following examples should not be considered limiting on the range of applications of the tester, the testing system and the testing methods described herein.

Figure 1B:
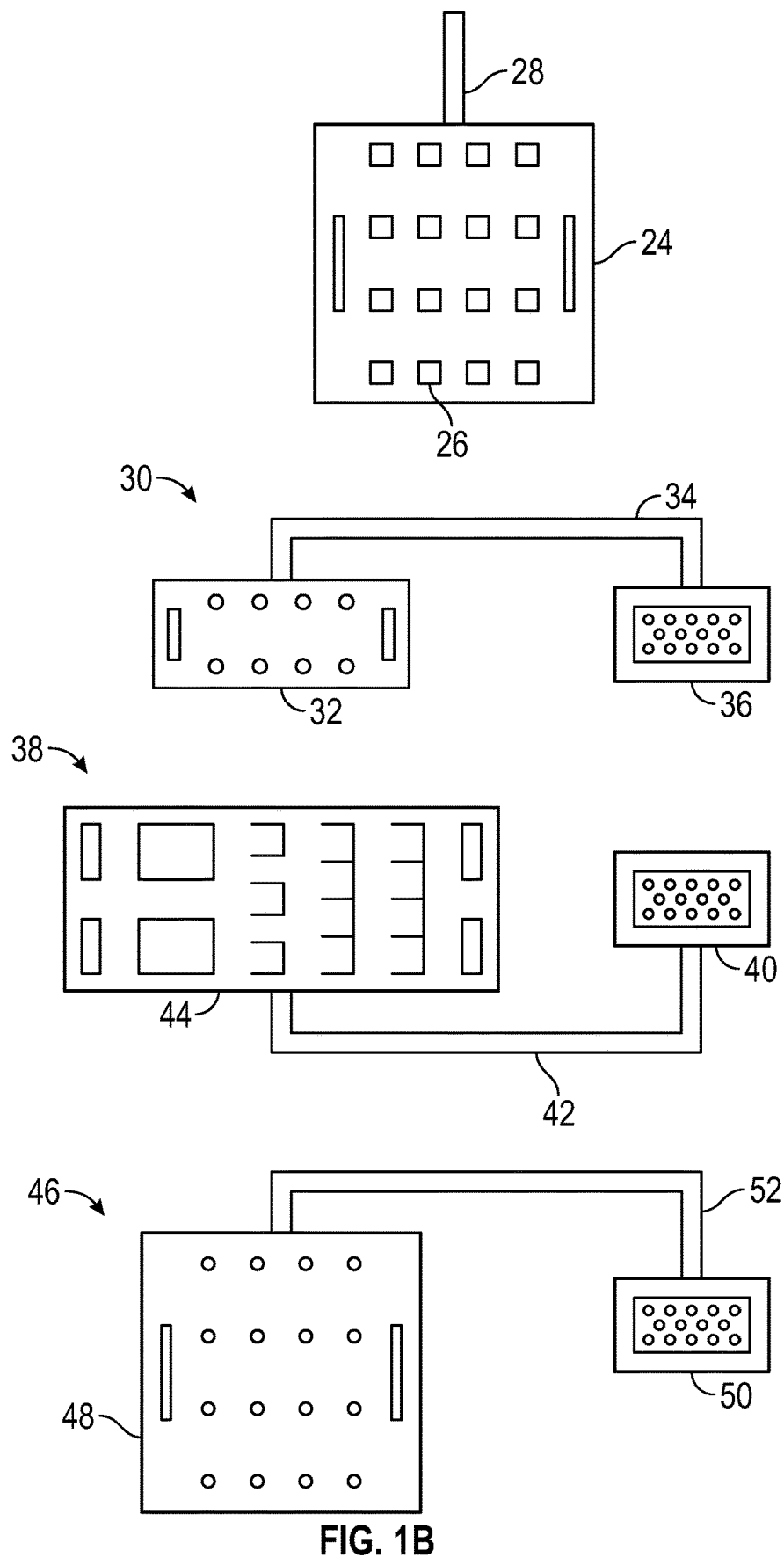

FIGS. 1A and 1B is a block diagram of a testing system 10 in accordance with some embodiments of the present disclosure. Among other electrical properties, the testing system 10 can be used to detect impedance anomalies in a wiring harnesses that can be used to detect the location(s) of electrical faults within the wiring harnesses. In other embodiments, one or more electrical properties (e.g. voltage, current or resistance) are measured to detect any fault condition in an electrical component.

The testing system 10 is configured to test electrical characteristics of a plurality of different electrical components 16, 20, 28 regardless of the number of wires and regardless of the types and sizes of connectors 12, 22, 24 that they include. In the illustrative embodiment of FIGS. 1A and 1B, first, second and third electrical components 16, 20, 28. A vehicle includes many more electrical components to be tested but FIGS. 1A and 1B illustrates three such electrical components for ease of illustration. Taking an example of the electrical components as wiring harnesses, the configuration of the wiring harness used in a vehicle varies depending on the implementation. Each electrical component 16, 20, 28 can include a different number of wires. The various wires of the electrical components 16, 20, 28 can be connected to one or more connectors 12, 22, 24. As such, the electrical components 16, 20, 28 can typically include different number of wires and different types of connectors 12, 22, 24 that receive those wires. The connectors 12, 22, 24 can be of different types in that they have different sizes, different shapes, different numbers and shapes of terminals 14, 18, 26, different locations of the terminals 14, 18, 26 depending on the particular implementation of the wiring harness. That is, the same tester connector 90 does not connect to each of the first, second and third connectors 12, 22, 24 either physically or electrically because a number of terminals (or pins) (connected to respective wires), the shape/size/position of the terminals and/or the shape/size of the connectors varies between the first, second and third connectors 12, 22, 24. Since the number of wires and terminals in the first, second and third connectors 12, 22, 24 varies, a testing scheme also varies depending on the electrical component 16, 20, 28 being tested to ensure that all pairs of terminals are fault tested. As will be further described herein, a tester 60 is disclosed having custom testing specifications for each type of electrical component in a database and custom adapters are provided to connect the same tester connector 90 to different connectors 12, 22, 24 of the first, second and third electrical components 16, 20, 28.

In FIGS. 1A and 1B, a first electrical component 16, a second electrical component 20 and a third electrical component 28 are illustrated that each include respective connectors, specifically a first connector 12, a second connector 22 and a third connector 24. The exemplary embodiment of FIGS. 1A and 1B may be a wiring harness for use in a vehicle such as those that are incorporated within a door of a vehicle. This particular example is non-limiting and is shown only for sake of illustrating one exemplary embodiment. However, in other embodiments, the testing system 10 may be configured to test electrical components associated with fewer or more connectors.

The testing system 10 includes a tester 60 that is able to test many different electrical components having different connectors. The tester 60 includes a display device 62, an input device 64, output lighting 66, analog circuitry 68, memory 76, processor 74, a communications device 70, a power source 72, a charging port 84 and a data port 82.

The tester 60 includes at least one processor 74 and a computer readable storage device or memory 76. The processor 74 can be any custom made or commercially available processor, a central processing unit (CPU), a graphics processing unit (GPU), an auxiliary processor among several processors associated with the processor 74, a semiconductor based microprocessor (in the form of a microchip or chip set), a macro processor, any combination thereof, or generally any device for executing instructions. In one exemplary embodiment, the processor is a Raspberry pi or Arduino to control the logic of testing circuits. The memory 76 may include volatile and nonvolatile storage in read-only memory (ROM), random-access memory (RAM), and keep-alive memory (KAM), for example. KAM is a persistent or non-volatile memory that may be used to store various operating variables while the processor 74 is powered down. The memory 76 may be implemented using any of a number of known memory devices such as PROMs (programmable read-only memory), EPROMs (electrically PROM), EEPROMs (electrically erasable PROM), flash memory, or any other electric, magnetic, optical, or combination memory devices capable of storing data, some of which represent executable instructions, used by the processor 74 in controlling testing operations of the tester 60.

The memory stores programming instructions 78, which may include one or more separate programs, each of which comprises an ordered listing of executable instructions for implementing logical functions. The instructions, when executed by the processor 74 perform logic, calculations, methods and/or algorithms for automatically controlling a testing process. Although only one processor 74 is shown in FIGS. 1A and 1B, embodiments of the tester 60 can include any number of processors that communicate over any suitable communication medium or a combination of communication mediums and that cooperate to process the sensor signals, perform logic, calculations, methods, and/or algorithms, and generate control signals to automatically control features of the tester 60.

In various embodiments, one or more of the programming instructions of the processor 74 are embodied are configured to implement the methods and systems described herein for identifying an electrical component and adapter connected to the tester connector, retrieving a testing specification from a database and performing the defined test per the testing specification, as will be described further below.

The memory 76 further stores a database of testing specifications 80. The testing specifications associate, in a database record, identification data for one of the first, second and third electrical components 16, 20, 28 (and many other electrical components) with a description of a testing scheme to be applied including all pairwise terminals to be tested, the electrical signal to be applied, the electrical property to be measured and other characteristics of the test. The database record further includes reference values for each pairwise terminal of an electrical property that is measured in the test. The reference values are indicative of a healthy circuit. The measured values of the electrical property from the test and the reference values can be compared to distinguish a faulty and a non-faulty circuit. Each record of the database of testing specifications 80 differ based on differing configurations of the identified electrical component such as number of terminals/wires to be tested, pairs of terminals to which an electrical signal is to be applied for the purpose of measuring the electrical property between the pair of terminals, etc.

The tester 60 includes a communications device 70, which may be configured to wirelessly communicate information to and from remote servers and/or other remote computing devices. In an exemplary embodiment, the communications device 70 is a wireless communication system configured to communicate via a wireless local area network (WLAN) or by using cellular data communication. The communications device 70 may additionally, or alternately, communicate the information via a wired connection, as illustrated by the data port 82. The communications device 70 receives additional records for the database of testing specifications 80, receives an indication of records to be removed from the database of testing specifications 80 and other updates to the database of testing specifications 80. The communications device 70 also allows software updates for the programming instructions 78. By updating the database of testing specifications 80, new or changed electrical components can be tested using the same tester 60. This may occur for a new vehicle model having changed sensors and wiring harness configurations.

The tester 60 includes the power source 72, which may be a battery source. The battery may be rechargeable via a charging port 84. The power source 72 provides power to each of the components of the tester 60 including the analog circuitry 68 for powering testing and output of test results.

The analog circuitry 68 includes various components such as an op-amp, resistors, capacitors, potentiometers, ammeters, transistors and amplifiers in order to generate a signal to be applied to pairwise terminals 14, 18, 26 of the connectors 12, 22, 24, which is conducted through the tester connector 90 and a connected adapter 30, 38, 46. The analog circuitry 68 includes a multiplexer 86. The multiplexer 86 is responsive to a selection by the processor 74 of a particular pair of terminals of a connector 12, 22, 24 and outputs an electrical signal connecting the selected pair and testing the selected pair (and the wires connected thereto) by measuring an electrical property, e.g. using the ammeter and/or the potentiometer. The analog circuitry 68 may include protection circuitry to prevent damaging of the multiplexer 86. The processor 74 is configured to select all combinations of pairs of terminals 14, 18, 26 according to the testing specification retrieved from the database of testing specifications 80 that corresponds to a connected electrical component 16, 20, 28 under test. The testing specification may map pins (or other terminal types) of the tester connector 90 to terminals 14, 18, 26 of a connected electrical component 16, 20, 28 with each map differing in dependence on a particular configuration of the electrical component 16, 20, 28 identified in the testing specification. In this way, the multiplexer 86 controls output of a signal to each pair of terminals 14, 18, 26 so that all terminals, wires, and connections are tested. Although, the testing occurs in a time multiplexed fashion, the test results are output substantially instantaneously from a user perspective. The test can involve application of electrical current to test for continuity of the circuit associated with the selected pair of terminals. The test may additionally, or alternatively, involve time domain reflectometry by which test pulses are applied to the selected pair of terminals and a reflected signal is measured.

Time domain reflectometry can be used to characterize and locate faults in conductive cables (for example, wire pairs), such as those used in a wiring harness. The time-domain reflectometry can also be used to locate discontinuities in terminals, the multiplexer, or any other electrical path. During testing of a particular wiring harness (or other electrical component), the multiplexer 86 sequentially transmits test pulses (having relatively short rise-times) to a pair of circuits of the wiring harness (or other electrical component) being tested. If the conductors in that circuit of the wiring harness have a uniform impedance and are properly terminated, the entire transmitted test pulse will be absorbed and no signal will be reflected back toward the analog circuitry 68. By contrast, if any impedance discontinuities are present, they will cause some of the test pulse to be reflected back towards the analog circuitry, which can be measured.

The processor 74 receives one or more measured values of one or more electrical properties from the analog circuitry 68 as a result of the test and allocates the measured values to the selected pair of terminals 14, 18, 26. The processor 74 thus obtains an array of test results for each pair combination. Further, the processor 74 reads one or more reference values for one or more electrical properties from the testing specification. The reference values may differ for each electrical component 16, 20, 28 and/or for each pair of terminals 14, 18, 26. The processor 74 compares the reference values with the measured values to determine whether any pair of terminals (and the associated circuit) is faulty based on the measured values being different from the reference values beyond a defined limit.

The tester 60 allows for testing of circuits in pairs including testing resistance to determine a faulty circuit in a pair, and for other testing including detection of circuit mis-indexes, opens, shorts, and terminal crimp quality, etc. The measured values can be compared with predetermined gold source standard reference values for that particular electrical component construction (e.g. that particular terminal pair) with associated components such as wire type, terminals and connectors.

The tester includes an input device 64. The input device 64 includes one or more of a keyboard, joystick, multi-way rocker switches, mouse, trackball, touch screen, touch pad, data entry keys and/or any other suitable device. The input device 64 allows a user to select various options such as to initiate update of the database of testing specifications 80, initiate a test, to view test results in detail, to report test results to a remote server, etc.

The tester 60 includes a display device 62 and output lighting 66. The output lighting 66 provides an immediate indication of whether the electrical component 16, 20, 28 has passed or failed the test using different colored lighting (e.g. a red color light and a green color light). The output lighting may be LED lighting. Further, a third color light may indicate that test results are erroneous due to some fault issue with the tester 60 such that the test should be performed again. The display device 62 may provide a graphical or alphanumeric indication of details of any failed test such as identifying specific pairs of terminals 14, 18, 26 that have found to be faulty. The display device 62 may also allow a user to view the measured values from the test for a deeper understanding of the fault. The display device 62 can provide a user interface for guiding a user through various menus to select various options using the input device 64, such as initiate test, view test result in detail, etc. In other embodiments, the test results may be displayed only on the display device 62 without provision of the output lighting 66. The display device 62 may be an LCD/epaper display to display wiring harness fail and pass pins in a graphical format. An audible output identifying the test result as pass, fail and optionally tester fault may be provided using a speaker and in addition to, or in place of, the output lighting 66.

The testing system 10 in the exemplary embodiment of FIGS. 1A and 1B further includes first, second and third adapters 30, 38, 46 that physically and electrically connect between the tester connector 90 and the first electrical component 16, the second electrical component 20 and the third electrical component 28. A respective adapter 30, 38, 46 is provided for each different configuration of electrical component 16, 20, 28 in order to physically and electrically mate with the tester connector 90 at one end of the adapters 30, 38, 46 and to mate with the connecter 12, 22, 24 of the electrical component 16, 20, 28 at the other end of each of the adapters 30, 38, 46. That is, the first, second and third adapters 30, 38, 46 respectively include first, second and third adapter-component connectors 32, 44, 48 at one end of first, second and third cables 34, 42, 52 that include a number and placement of terminals that match the first, second and third terminals 14, 18 26 of the first, second and third connectors 12, 22, 24 and which dimensionally fit (e.g. plug into) with the first, second and third connectors 12, 22, 24. At the other end of the first, second and third cables 34, 42, 52 are first, second and third adapter-tester connectors 36, 40, 50, respectively, which are the same in terms of number and placement of terminals, physical shape and dimensions in order to allow electrical connection with, and plugging connection with, the same tester connector 90.

The first, second and third adapters 30, 38, 46 and the database of testing specifications 80 allow many different types of wiring harnesses (and other electrical components) to be tested using a single tester 60 and a single type of tester connector 90 even though each wiring harness has different connector configurations and wiring circuits to be tested.

The tester 60 is further configured to detect which adapter 30, 38, 46 is connected to the tester connector 90 and/or to automatically detect the electrical component 16, 20, 28 that is connected to the tester connector 90 via the adapter 30, 38, 46. In one exemplary embodiment, a characteristic electrical property is measured for the detection such as resistance. In other embodiments, the tester 60 may be provided with a dedicated scanner for the detection such as a barcode, RFID, QR code or other wireless detection system. The processor 74 compares the electrical property (or other measured feature) to a look-up table stored in memory 76 or to corresponding data in the database of testing specifications 80 to determine identification data that uniquely identifies the detected electrical component 16, 20, 28. The identification data can be used to retrieve the corresponding record in the database of testing specifications 80 so as to obtain the testing specification for the detected electrical component 16, 20, 28. In embodiments, the custom adapters 30, 38, 46 have unique resistances from the tester 60 to the adapter 30, 38, 46 to wiring harness/sensor/other electrical component connector 12, 22, 24. This chain of components have unique resistance combinations to allow identification of each type of electrical component 16, 20, 28 so that the tester 60 can automatically identify any type of electrical component 16, 20, 28 and retrieve the corresponding testing specification.

Processes of operating the tester 60 and performing a test on electrical components are discussed with reference to the exemplary embodiments of FIGS. 2A, 2B and 3A,3B. As can be appreciated in light of the disclosure, the order of operation within the method is not limited to the sequential execution as illustrated in FIGS. 2 and 3, but may be performed in one or more varying orders as applicable and in accordance with the present disclosure.

Figure 2A:
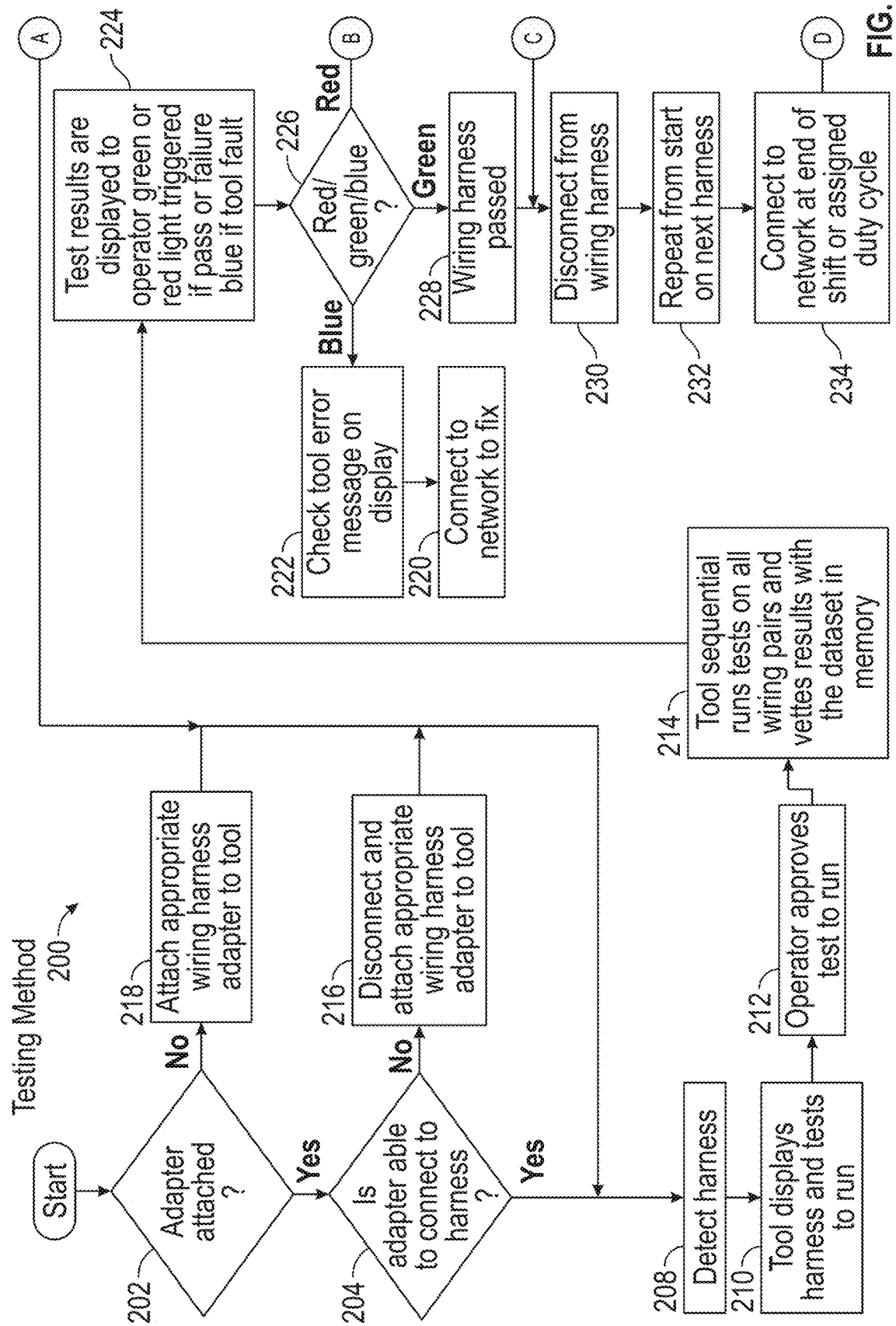
FIGS. 2A and 2B provide a flowchart illustrating method steps of testing an electrical component, in accordance with various embodiments.
Figure 2B:
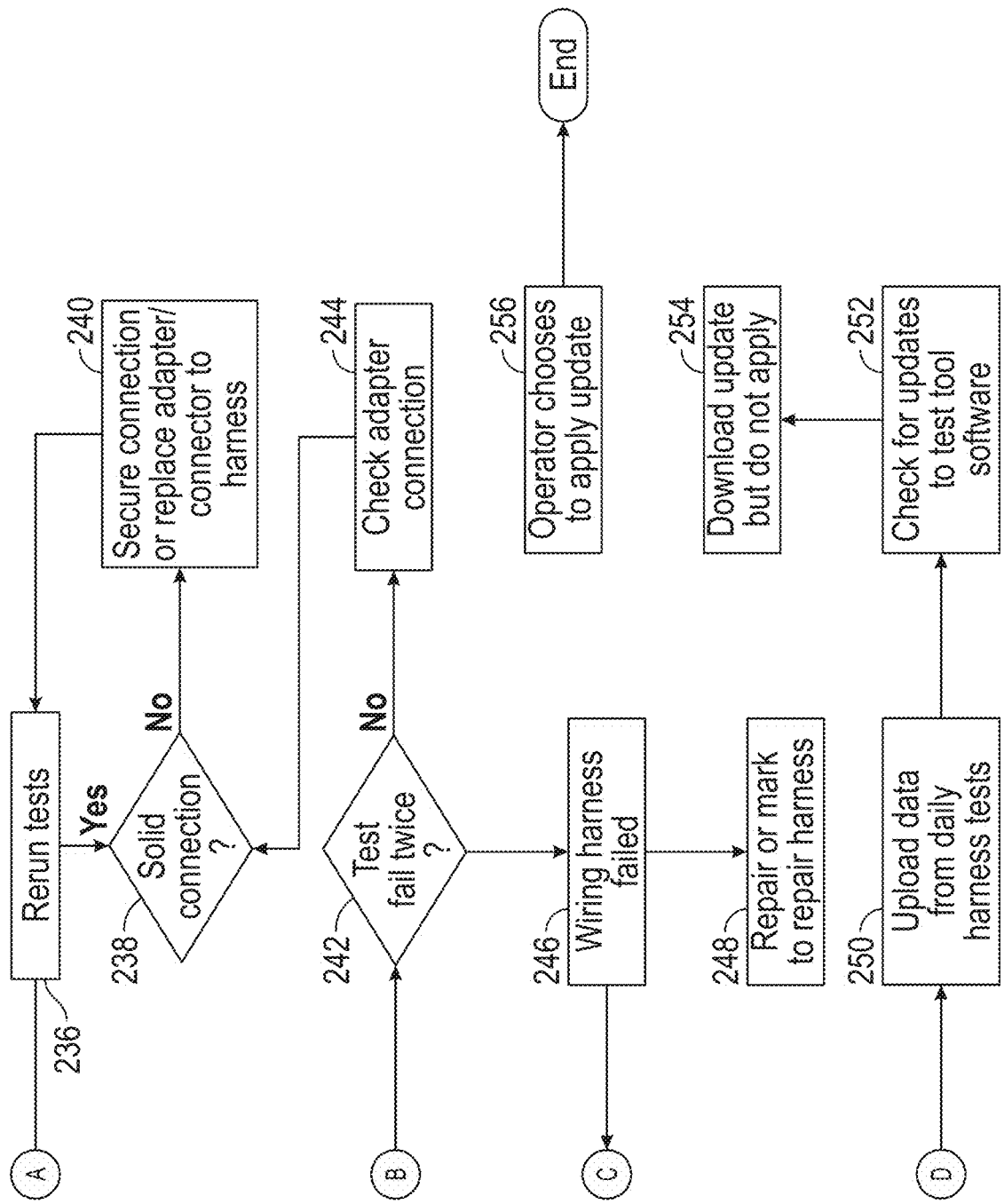
Figure 3A:
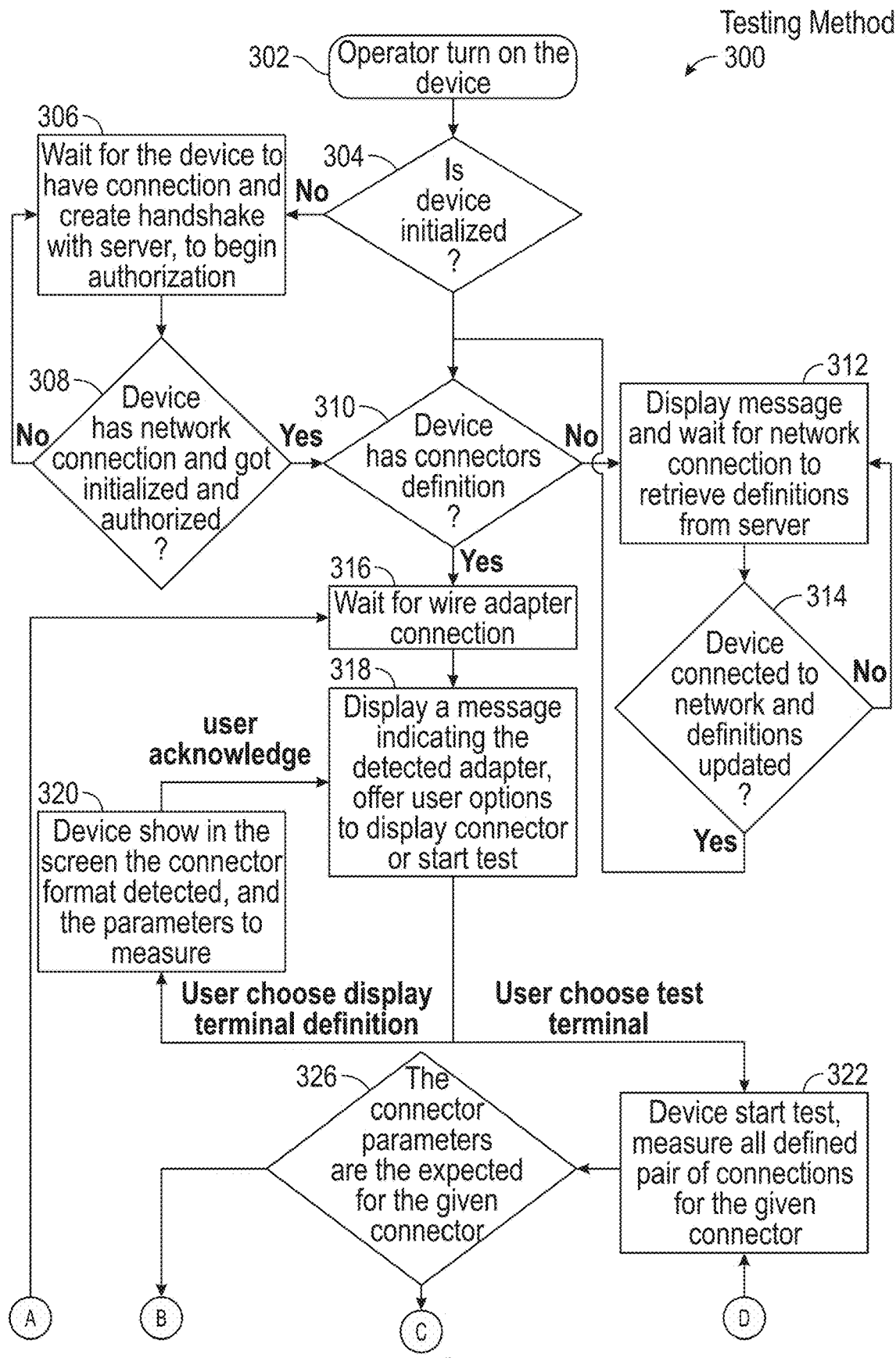
FIGS. 3A and 3B provide a flowchart illustrating method steps of testing an electrical component, in accordance with various embodiments.
Figure 3B:
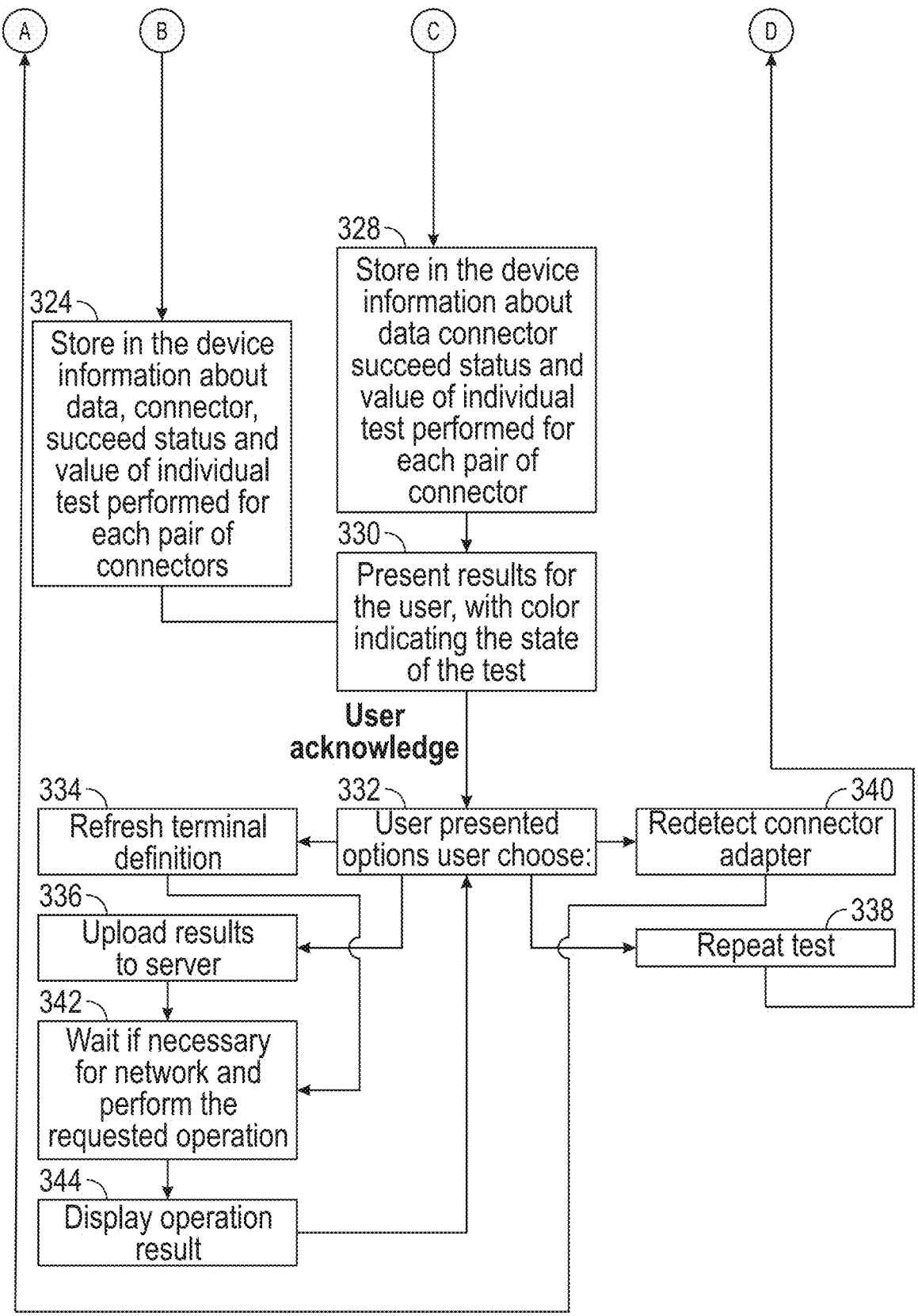

Referring to FIGS. 2A and 2B, an exemplary test method 200 in accordance with the present disclosure is illustrated. Although FIGS. 2A and 2B refer to testing wiring harnesses, other electrical components may be tested, particularly those installed in a vehicle. At 202, an operator checks whether an adapter 30, 38, 46 is connected to the tester connector 90. If not, an appropriate adapter 30, 38, 46 is connected to the tester connector 90 at 218. If so, the operator, at 204, checks that adapter 30, 38, 46 is able to connect to the connector 12, 22, 24 of the wiring harness (or other electrical component 16, 20, 28) to be tested. If the wiring harness is not able to connect, then the adapter 30, 38, 46 is changed to one that does connect correctly at 216. If the wiring harness is able to connect to the adapter 30, 38, 46, the tester 60 detects and identifies the electrical component 16, 20, 28 at 208 by measuring a characteristic electrical property thereof. Based on the identified electrical component, the processor retrieves a corresponding testing specification from the database of testing specifications 80. The tester 60 may display, on the display device 62, a graphical representation of the electrical component or otherwise display identification data corresponding to the detected electrical component at 210. Further, one or more tests to run may be displayed for selection and approval by an operative using the input device 64 at 212.

At 214, the tests are run in response to the user input at 212. Sequential tests are performed by applying an electrical signal to all wiring pairs described in the retrieved testing specification and according to the associated map of terminals of the tester connector 90 and the terminals 14, 18, 26 of the first, second and third connectors 12, 22, 24. The measured values from the tests are compared to reference values in the testing specification in order to vet the test results. Based on the comparison, at 224, the test results are output to the operator through the output lighting with different colors of lighting representing whether the electrical component 16, 20, 28 has passed or failed the test or whether a fault in the tester 60 has been detected. At 226, the operator checks the color of the output lighting 66. If an error in the tester 60 is detected, a tool error message is output to the display device 62 at 222 providing an indication of further details of the error. The tool error may be corrected at 220 by connecting to a remote service via the communications device 70 to retrieve updates to software and/or updates to the database of testing specification 80. If the output lighting 66 indicates that the electrical component has passed the test (at 228), the electrical component 16, 20, 28 and the adapter 30, 38, 46 can be disconnected (at 230) from the tester 60 and the testing method 200 can be repeated for another electrical component (at 232). If the output lighting 66 indicates that the test has failed, the test is performed again at 242. If the test fails twice, the electrical component 16, 20, 28 is either discarded as failed at 246 or repaired or marked to be repaired at 248. If the test has failed once, the adapter connection (at both ends) is checked at 244 and, if the connection is not solid (at 238), the connection of the adapter is made more firm, or the adapter is replaced at 240. The tests are re-run at 236 to see if the action taken at 240 fixed the cause of failure for the first test.

At 234, the tester 60 is connected to the remote server at predetermined intervals (e.g. once per day), which may be through an automatic schedule or through manual request using the input device 64. Tests results for each test conducted during the predetermined interval may be uploaded to the remote service at 250. At 252 and 254, any updates to software embodied by the programming instructions 78 may be found and downloaded. At 256, the operator may be given an opportunity to accept the software update using the input device 64.

The testing method 200 can be re-run for the first, second and third electrical components 16, 20, 28 (and further electrical components) by switching between the first, second and third adapters 30, 38, 46 and retrieving the testing specification according to an identified one of the first, second and third electrical components 16, 20, 28. The tester 60 changes testing schemes according to the testing specification, e.g. by having a different pattern of pairs of terminals that have an electrical test signal applied between them, changing the number of signals and/or by having changed reference values for measured electrical properties.

Referring to FIGS. 3A and 3B, another exemplary test method 300 in accordance with the present disclosure is illustrated. Although FIGS. 2A and 2B refers to testing wiring harnesses, other electrical components may be tested, particularly those installed in a vehicle. At 302, the tester 60 is powered on (e.g. using a power on/off switch or button). At 304, the processor 74 checks whether the tester is initialized, which may include determining whether the device has registered with an authorized remote server by checking corresponding information in the memory 76. If the device has not been initialized, the processor 74 connects to the remote server (e.g. using a handshake protocol) at 308 and registers therewith so that reported test results are allocated to a specific tester 60 at the remote server. At 310, the processor 74 determines whether the database of testing specifications has been populated. If not, a message is displayed on the display device 62 to alert a user to connect to the remote server (at 312) and download the testing specifications (at 314). Alternatively, user input is not required, and the testing specifications are automatically downloaded.

At 316, the processor 74 determines whether an adapter 30, 38, 46 is connected to the tester connector 90 by detecting electrical contact. If an adapter 30, 38, 46 is connected, the adapter 30, 38, 46 is detected (or the combination of adapter and electrical component 16, 20, 28) by measuring a characteristic electrical property. A testing specification that uniquely corresponds to the detected adapter 30, 38, 46 is loaded from the database of testing specifications 80. At 318, a message is displayed on the display device 62 indicating the detected adapter 30, 38, 46. A user may select, using the input device 64, to graphically display terminal information regarding the terminals 14, 18, 26 of the connector 12, 22, 24 connected to the adapter 30, 38, 46. In response, the tester 60 displays, at 320, a graphical representation of the terminal configuration based on data included in the testing specification. The user may also select to start the test.

At 322, the test of the electrical component 16, 20, 28 is initiated and all pairs of terminals 14, 18, 26 (or connections or circuits) according to the testing specification are tested by applying an electrical test signal therebetween and measuring an electrical property. At 326, measured values of the electrical property are compared to reference values found in the testing specification to determine whether the parameters are as expected for the electrical component 16, 20, 22. If the comparison indicates failure of the electrical component 16, 20, 22, test information is stored in memory 76 (at 324) including date, identification of the connector 12, 22, 24 or the electrical component 16, 20, 22, the failed status, and the measured values for each test performed with respect to each pair of terminals tested 14, 18, 26. The electrical component 16, 20, 28 can be labelled as failed for subsequent repeat testing, for replacement or for repair. If the comparison indicates success of the electrical component 16, 20, 22, test information is stored in memory 76 (at 328) including date, identification of the connector 12, 22, 24 or the electrical component 16, 20, 22, the success status, and the measured values for each test performed with respect to each pair of terminals tested 14, 18, 26. At 330, a test result for the electrical component 16, 20, 28 is indicated through differential output lighting 66.

A user may be presented with selectable options on the display device 62 at 330. These options may include updating the database of testing specifications 80 at 324, uploading test results to the remote server at 336, repeating the test at 338 and re-detecting the adapter 30, 38, 46 at 340. A user may select any one of these options through the input device 64 and the processor 74 acts accordingly. If options 324 or 336 are selected, the processor 74 waits for network connection at the communications device 70 (if necessary) and performs the update/upload at 342 and informs the operator at 344 by message on the display device 62.

While at least one exemplary embodiment has been presented in the foregoing detailed description, it should be appreciated that a vast number of variations exist. It should also be appreciated that the exemplary embodiment or exemplary embodiments are only examples, and are not intended to limit the scope, applicability, or configuration of the disclosure in any way. Rather, the foregoing detailed description will provide those skilled in the art with a convenient road map for implementing the exemplary embodiment or exemplary embodiments. It should be understood that various changes can be made in the function and arrangement of elements without departing from the scope of the disclosure as set forth in the appended claims and the legal equivalents thereof.

What is claimed is:

1. A tester for testing an electrical component, the tester comprising:
   a database of a plurality of testing specifications for a plurality of different electrical components, wherein the database stores, for each testing specification, identification data that includes a resistance that defines an associated electrical component;
   a tester connector for physically and electrically connecting to different electrical components;
   an output device;
   at least one processor in operable communication with the database and the output device, wherein the at least one processor is configured to execute program instructions, wherein the program instructions are configured to cause the at least one processor to:
      identify a resistance of an electrical component connected to the tester connector and provide corresponding identification data;
      retrieve a testing specification associated with the electrical component from the database using the identification data;
      command a test of the electrical component according to the testing specification; and
      output an indication of a result of the test through the output device.

2. The tester of claim 1, comprising analog circuitry through which the test is conducted.

3. The tester of claim 1, wherein the electrical component is identified by measuring an electrical property of the electrical component connected to the tester connector, wherein the electrical property is characteristic of the electrical component connected to the tester connector.

4. The tester of claim 1, wherein the test is to recognize a fault in the electrical component.

5. The tester of claim 1, wherein the electrical component includes at least one of a wiring harness and a sensor.

6. The tester of claim 1, comprising a multiplexer, wherein the testing specifications in the database describe pairs of terminals of a connector of respective electrical components, wherein the test includes applying an electrical signal to each of the pairs of terminals via the multiplexer and according to the testing specification.

7. The tester of claim 1, wherein the output device includes at least one of different color lighting and a display including a screen.

8. The tester of claim 1, wherein the testing specifications in the database describe reference values of an electrical property, wherein the test includes measuring measurement values of the electrical property, and wherein the program instructions are configured to cause the at least one processor to: determine the result of the test by including comparing the reference values and the measurement values.

9. The tester of claim 1, wherein the tester is a portable device.

10. The tester of claim 1, comprising a battery for providing power to conduct the test.

11. The tester of claim 1, comprising a communications device, wherein the program instructions are configured to cause the at least one processor to: add testing specifications to the database, modify the testing specifications or remove testing specifications from the database based on data received from a remote service via the communications device.

12. A testing system, comprising:
a plurality of adapters, each adapter comprising an adapter-component connector at one end of a cable and an adapter-tester connector at another end of the cable, wherein respective adapter-component connectors are for physically and electrically connecting to different electrical components;
a tester for testing one of the electrical components, the tester comprising a tester connector for physically and electrically connecting to any one of the adapter-tester component connectors;
a database of a plurality of testing specifications for a plurality of electrical components, wherein the database stores, for each testing specification, identification data that includes a resistance that defines an associated electrical component;
an output device;
at least one processor in operable communication with the database and the output device, wherein the at least one processor is configured to execute program instructions, wherein the program instructions are configured to cause the at least one processor to:
identify a resistance of one of the electrical components connected to the tester connector using one of the plurality of adapters and provide corresponding identification data;
retrieve a testing specification associated with the electrical component from the database using the identification data;
command a test of the one of the electrical components according to the testing specification; and
output an indication of a result of the test through the output device.

13. The testing system of claim 12, wherein the tester comprises analog circuitry through which the test is conducted.

14. The testing system of claim 12, wherein the one of the electrical components is identified by measuring an electrical property of at least one of: the one of the electrical components and the one of the plurality of adapters, wherein the electrical property is characteristic of at least one of the one of the electrical components and the one of the adapters.

15. The testing system of claim 12, wherein the electrical components include at least one of a wiring harness and a sensor.

16. The testing system of claim 12, wherein the tester comprises a multiplexer, wherein the testing specifications in the database describe pairs of terminals of a connector of respective electrical components, wherein the test includes applying an electrical signal to each of the pairs of terminals via the multiplexer and according to the testing specification.

17. The testing system of claim 12, wherein the testing specifications in the database describe reference values of an electrical property, wherein the test includes measuring measurement values of the electrical property, and wherein the program instructions are configured to cause the at least one processor to: determine the result of the test by including comparing the reference values and the measurement values.

18. The testing system of claim 12, where the tester comprises a communications device, wherein the program instructions are configured to cause the at least one processor to: add testing specifications to the database, modify the testing specifications or remove testing specifications from the database based on data received from a remote server via the communications device.

19. A method of testing an electrical component of a vehicle, the electrical component comprising a harness or a sensor, the method comprising:
providing a plurality of adapters, each adapter comprising an adapter-component connector at one end of a cable and an adapter-tester connector at another end of the cable, wherein respective adapter-component connectors are for physically and electrically connecting to different electrical components of the vehicle;
providing a tester for testing one of the electrical components, the tester comprising a tester connector for physically and electrically connecting to any one of the adapter-tester component connectors;
providing a database of a plurality of testing specifications for a plurality of electrical components, wherein the database stores, for each testing specification, identification data that includes a resistance that defines an associated electrical component;
providing an output device;
identifying, via at least one processor, a resistance of one of the electrical components connected to the tester connector using one of the plurality of adapters and providing corresponding identification data;
retrieving, via the at least one processor, a testing specification associated with the electrical component from the database using the identification data;
commanding, via the at least one processor, a test of the one of the electrical components according to the testing specification; and
outputting an indication of a result of the test through the output device.

20. The method of claim 19, wherein the tester comprises a multiplexer, and wherein the testing specifications in the database describe pairs of terminals of a connector of respective electrical components, and wherein the test includes applying an electrical signal to each of the pairs of terminals via the multiplexer according to the testing specification.

* * * * *